(12) United States Patent
Inoue (10) Patent No.: US 7,199,505 B2
(45) Date of Patent: Apr. 3, 2007

(54) PIEZOELECTRIC RESONATOR AND ELECTRONIC COMPONENTS USING THE SAME

(75) Inventor: Kenji Inoue, Tokyo (JP)

(73) Assignee: TDK Corporation, Tokyo (JP)

( * ) Notice: Subject to any disclaimer, the term of this patent is extended or adjusted under 35 U.S.C. 154(b) by 159 days.

(21) Appl. No.: 10/950,816

(22) Filed: Sep. 28, 2004

(65) Prior Publication Data

US 2005/0088061 A1    Apr. 28, 2005

(30) Foreign Application Priority Data

Oct. 28, 2003    (JP) .............................. 2003-367129

(51) Int. Cl.
*H01L 41/08*    (2006.01)
*H03H 9/00*    (2006.01)

(52) U.S. Cl. ...................... 310/321; 310/324; 310/365

(58) Field of Classification Search ................ 310/311, 310/321, 338, 313 D, 324, 323.01–323.19, 310/363–365

See application file for complete search history.

(56) References Cited

U.S. PATENT DOCUMENTS

| | | | | |
|---|---|---|---|---|
| 4,735,484 A | * | 4/1988 | Fesler | 385/4 |
| 5,711,888 A | * | 1/1998 | Trampler et al. | 210/748 |
| 5,760,663 A | * | 6/1998 | Pradal | 333/187 |
| 5,873,154 A | * | 2/1999 | Ylilammi et al. | 29/25.35 |
| 5,936,150 A | * | 8/1999 | Kobrin et al. | 310/324 |
| 6,472,954 B1 | | 10/2002 | Ruby et al. | |
| 7,138,889 B2 | * | 11/2006 | Lakin | 333/189 |
| 2004/0140869 A1 | * | 7/2004 | Marksteiner et al. | 333/189 |
| 2005/0218753 A1 | * | 10/2005 | Nakatsuka et al. | 310/324 |

FOREIGN PATENT DOCUMENTS

JP    01-200321    *    8/1989

* cited by examiner

*Primary Examiner*—Thomas M. Dougherty
(74) *Attorney, Agent, or Firm*—McGinn IP Law Group PLLC (57) ABSTRACT

A piezoelectric resonator is provided which is capable of acquiring an excellent Q characteristic while letting a film thickness of an upper electrode be larger. The piezoelectric resonator has a lower electrode and an upper electrode with a piezoelectric film being sandwiched between them. By applying a voltage between the lower and upper electrodes to let a bulk acoustic wave propagate through inner portions of the piezoelectric layer, a signal having a specified resonant frequency is obtained. The standing wave has a first wave loop at an interface on a side opposite to the piezoelectric film of the upper electrode and a wave node and a second wave loop in inner portions of the upper electrode directing from the interface toward the piezoelectric film. The film thickness of the upper electrode obtained when a wavelength of a standing wave is defined as "$\lambda$" is $0.4\lambda$ to $0.7\lambda$.

18 Claims, 10 Drawing Sheets

PIEZOELECTRIC RESONATOR AND ELECTRONIC COMPONENTS USING THE SAME

BACKGROUND OF THE INVENTION

1. Field of the Invention

The present invention relates to a piezoelectric resonator and more particularly to technology being able to be effectively used for improvement of a Q (Quality Factor) characteristic (that is, impedance ratio=anti-resonant resistance value/resonant resistance value), in particular.

2. Description of the Related Art

In a piezoelectric resonator such as a crystal resonator or a like using a bulk acoustic wave (BAW), a thickness of a film of its upper electrode is related to improvement of a Q characteristic to acquire a good frequency characteristic. When a wavelength of a standing wave occurring in the vicinity of a resonant frequency in a frequency band being used is defined as "$\lambda$", an upper electrode having a film thickness of about $0.06\lambda$ to $0.15\lambda$ is used.

To make large a film thickness of the upper electrode is effective in controlling an effective coupling coefficient or a like. However, since the Q characteristic is degraded as the film thickness of the upper electrode becomes large, in general cases, the film thickness of the upper electrode to be used is not far out of the range described above.

Moreover, improvements of a resonant characteristic in a piezoelectric resonator are described in U.S. Pat. No. 6,472,954.

However, if a film thickness of an upper electrode in a piezoelectric resonator is made small, electric resistance of a thin wiring layer manufactured by the same processes as those used for the upper electrode is also increased.

A thickness of the wiring layer can be made large in processes which are added after fabrication using a process being different from those used for the upper electrode or using the same process as used for the upper electrode, however, entire processes are increased, unfavorably causing an increase in manufacturing costs.

These problems occur commonly not only in a resonator but also in a filter or a like using the resonator.

SUMMARY OF THE INVENTION

In view of the above, it is an object of the present invention to provide a piezoelectric resonator being able to obtain an excellent Q characteristic while letting a film thickness of its upper electrode become larger.

As claimed in a first aspect of the present invention, there is provided a piezoelectric resonator including:

a substrate;

a lower electrode formed on the substrate;

an upper electrode formed on the substrate; and a piezoelectric film being sandwiched between the lower electrode and the upper electrode on the substrate;

wherein a signal having a specified resonant frequency is obtained by applying a voltage between the lower electrode and the upper electrode to let a bulk acoustic wave propagate through an inner portion of the piezoelectric film; and wherein a standing wave occurring in a vicinity of a resonant frequency in a frequency band being used has a first wave loop at an interface positioned on a side opposite to the piezoelectric film in the upper electrode and both a wave node and a second wave loop in an inner portion of the upper electrode directing from the interface toward a side the piezoelectric film.

In the foregoing, a preferable mode is one wherein a film thickness of the upper electrode obtained when a wavelength of the standing wave occurring in the upper electrode is defined as "$\lambda$" is $0.4\lambda$ to $0.7\lambda$.

Also, a preferable mode is one wherein the upper electrode is made up of Al (aluminum), Au (gold), or Mo (molybdenum).

Also, a preferable mode is one wherein the upper electrode is formed by stacking layers in the order of a conductive layer, an insulating layer, and another conductive layer.

Also, a preferable mode is one wherein the upper electrode is formed by stacking films in the order of an Al film, $SiO_2$ (silicon oxide) film, and another Al film and a sum of coefficients of film thicknesses normalized by a wavelength of the standing wave occurring in each of the films is 0.4 to 0.7.

Also, a preferable mode is one wherein an acoustic multi-layer film constructed by stacking films each having different acoustic impedance is formed between the substrate and the lower electrode and wherein an interlayer film having a specified acoustic impedance and having a film thickness obtained when a wavelength of the standing wave is defined as "$\lambda$" being $0.01\lambda$ to $0.1\lambda$ is formed between the acoustic multi-layer film and the lower electrode.

Also, a preferable mode is one wherein the interlayer film is made up of an AlN (Aluminum Nitride) film.

Also, a preferable mode is one wherein a dielectric film is formed between the upper electrode and the piezoelectric film.

Also, a preferable mode is one wherein the dielectric film is made up of an $SiO_2$ film.

Furthermore, a preferable mode is one wherein the piezoelectric resonator is an SMR (Solidity Mounted Resonator)—type piezoelectric resonator or a diaphragm-type piezoelectric resonator.

As claimed in a second aspect of the present invention, there is provided an electronic component using the piezoelectric resonator described above.

With the above configuration, the standing wave occurring in the upper electrode has, in addition to the first wave loop, the wave node and the second wave loop and, therefore, a decrease in oscillation energy of the bulk acoustic wave occurring in the piezoelectric film is suppressed and an excellent Q characteristic can be acquired. Since such the distribution of the standing wave is obtained by making a film thickness of the upper electrode have a specified value, it is made possible to achieve the piezoelectric resonator being capable of acquiring the excellent Q characteristic while letting the film thickness of the upper electrode become larger.

With still another configuration, the film thickness of the upper electrode is allowed to become larger and, therefore, formation of a wiring layer having a film thickness being larger than that of the electrode film by using processes being different from those employed in the formation of the film of the electrode film to reduce electrical resistance of the wiring is not required and formation of the wiring layer having a large film thickness and of low resistance by using the same processes as those employed in the fabrication of the upper electrode is made possible, thus enabling the processes to be simplified and manufacturing costs to be reduced.

Moreover, the present invention can be widely applied not only to a piezoelectric resonator but also to electronic components including a filter, duplexer, or a like using the piezoelectric resonator.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings. In the drawings used in the embodiment, the same reference numbers are assigned to components having the same functions as those in other drawings and duplicated descriptions are omitted accordingly. Moreover, in following descriptions, the best mode of carrying out the present invention is explained and, therefore, the present invention is not limited to the embodiment provided here.

Embodiment

Figure 1:
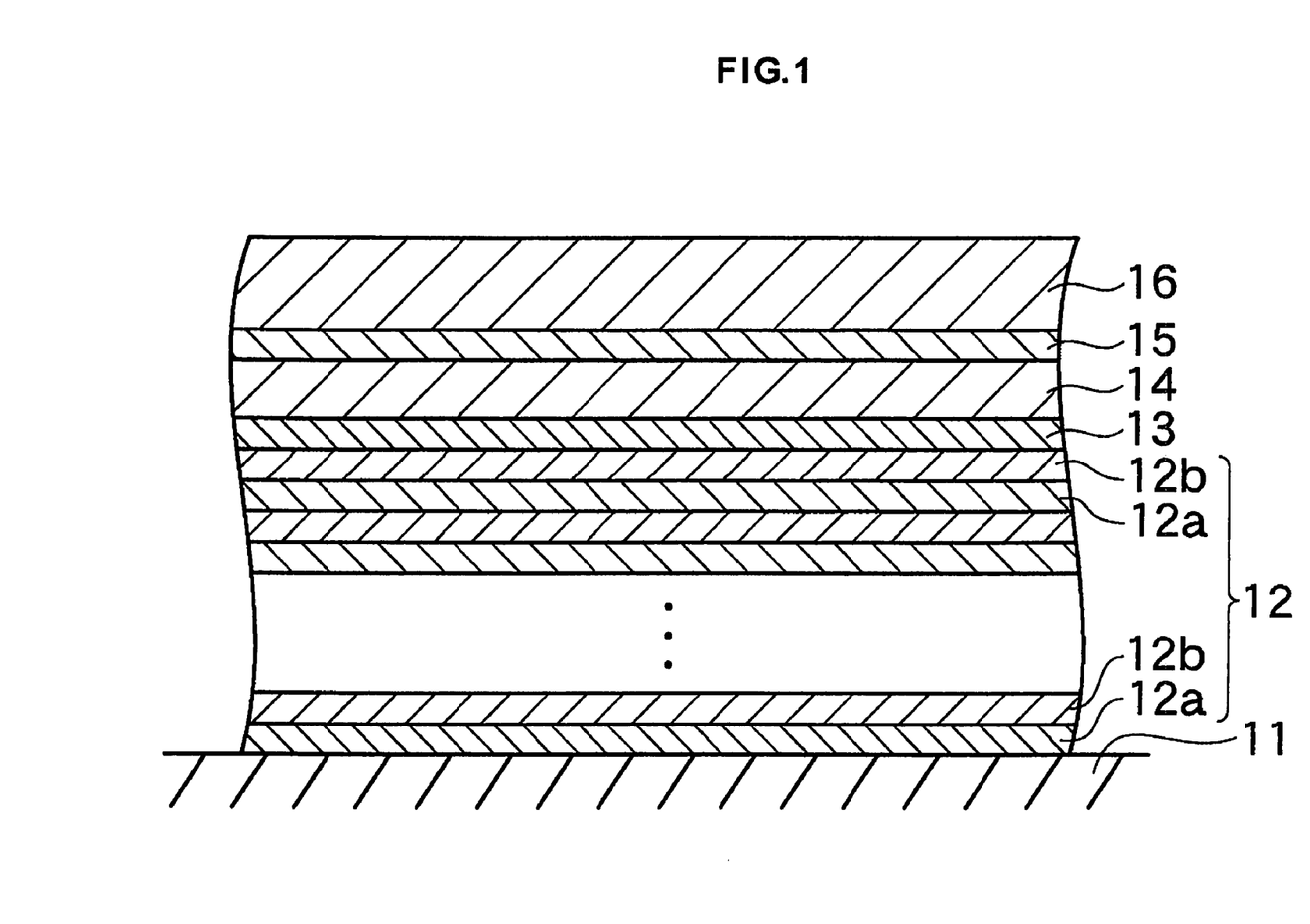
FIG. 1 is a cross-sectional view illustrating a piezoelectric resonator as claimed in an embodiment of the present invention.
Figure 2:
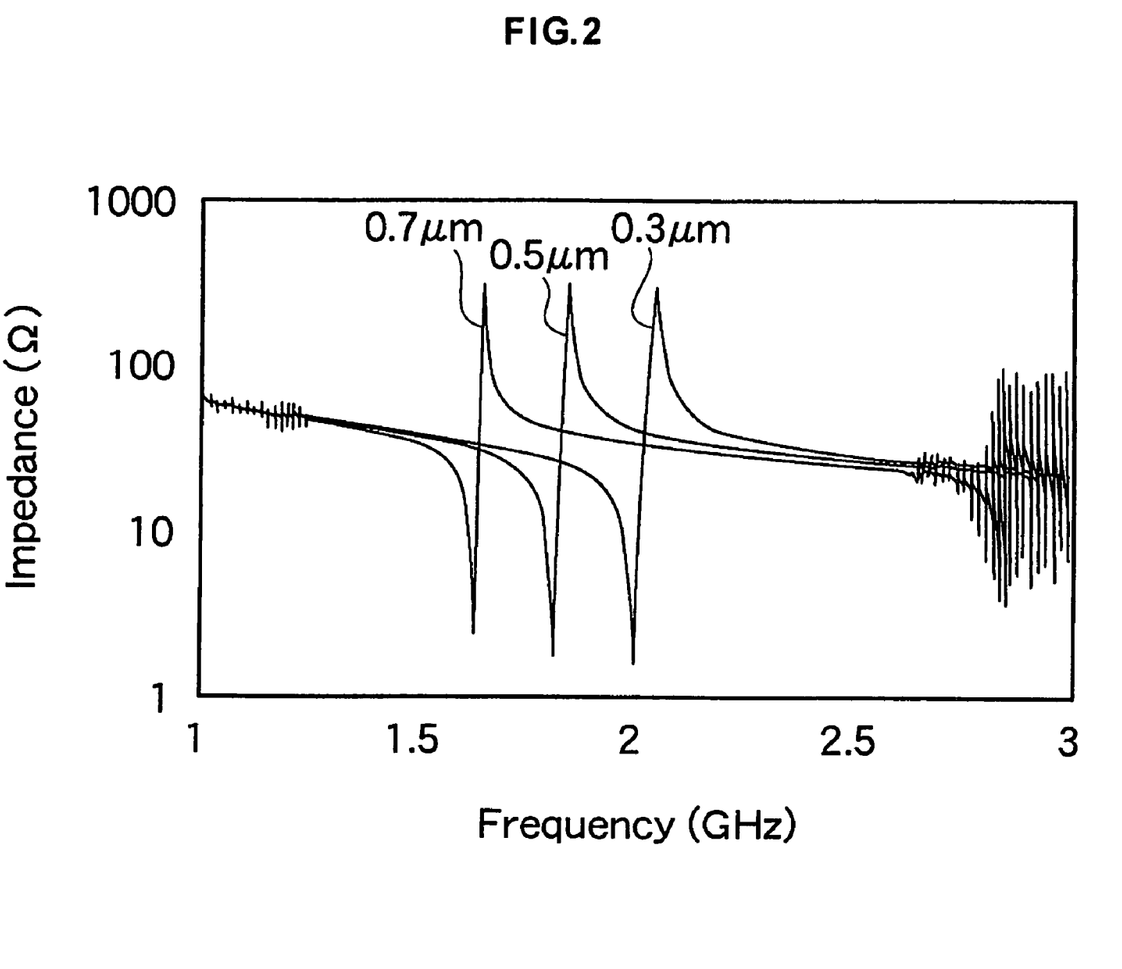
FIG. 2 is a graph showing a resonance characteristic of a conventional piezoelectric resonator having upper electrodes whose film thicknesses are different from each other.
Figure 3:
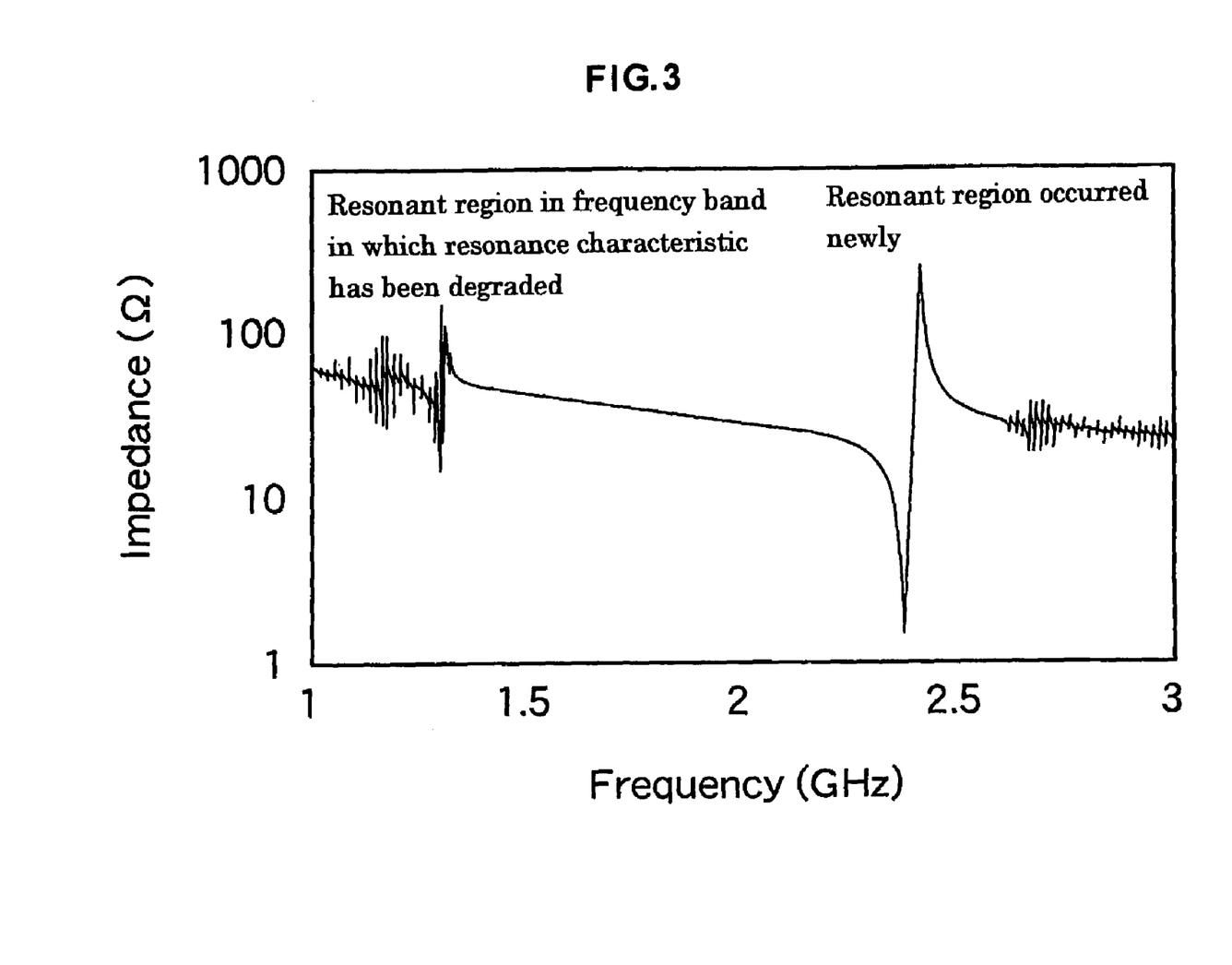
FIG. 3 is a graph showing a resonance characteristic of a piezoelectric resonator studied by the inventor of the present invention.
Figure 4:
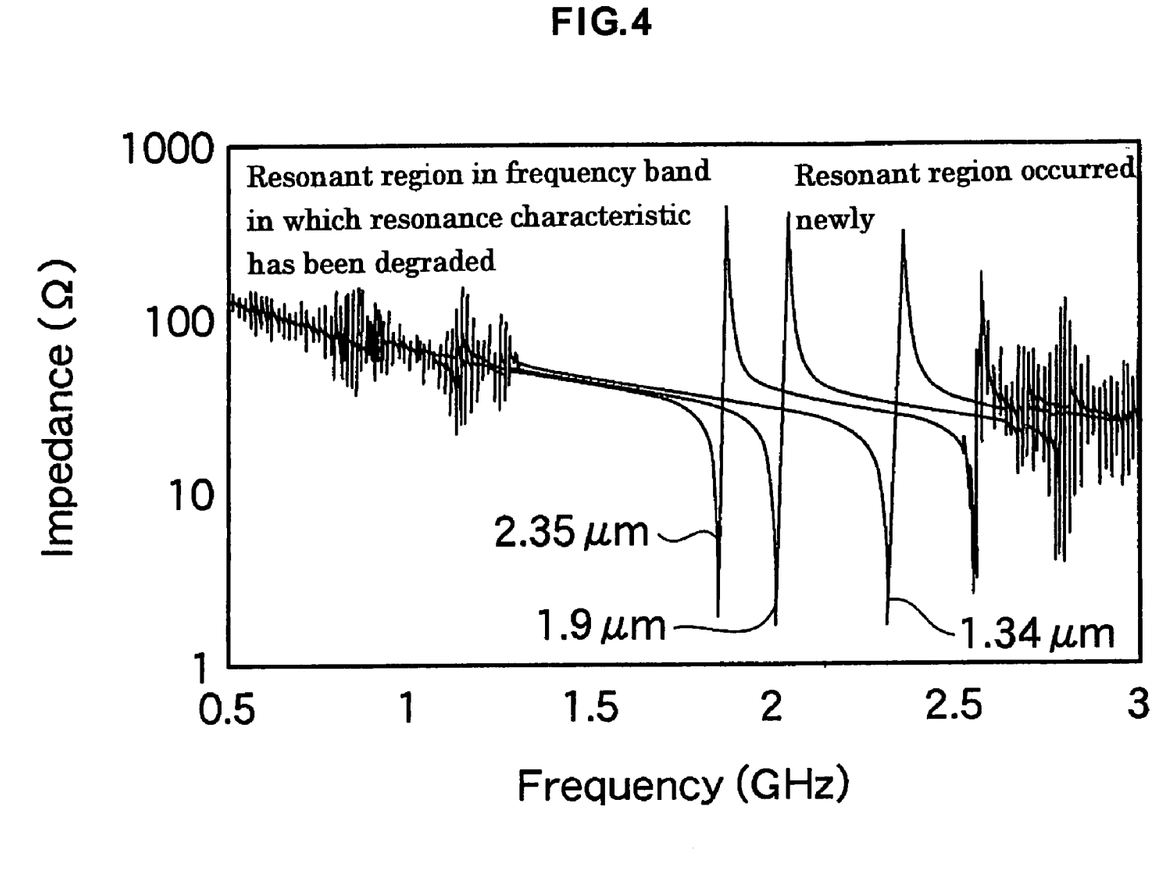
FIG. 4 is a graph showing a resonance characteristic of the piezoelectric resonator shown in FIG. 1 in which the film thickness of the upper electrode is changed.
Figure 5:
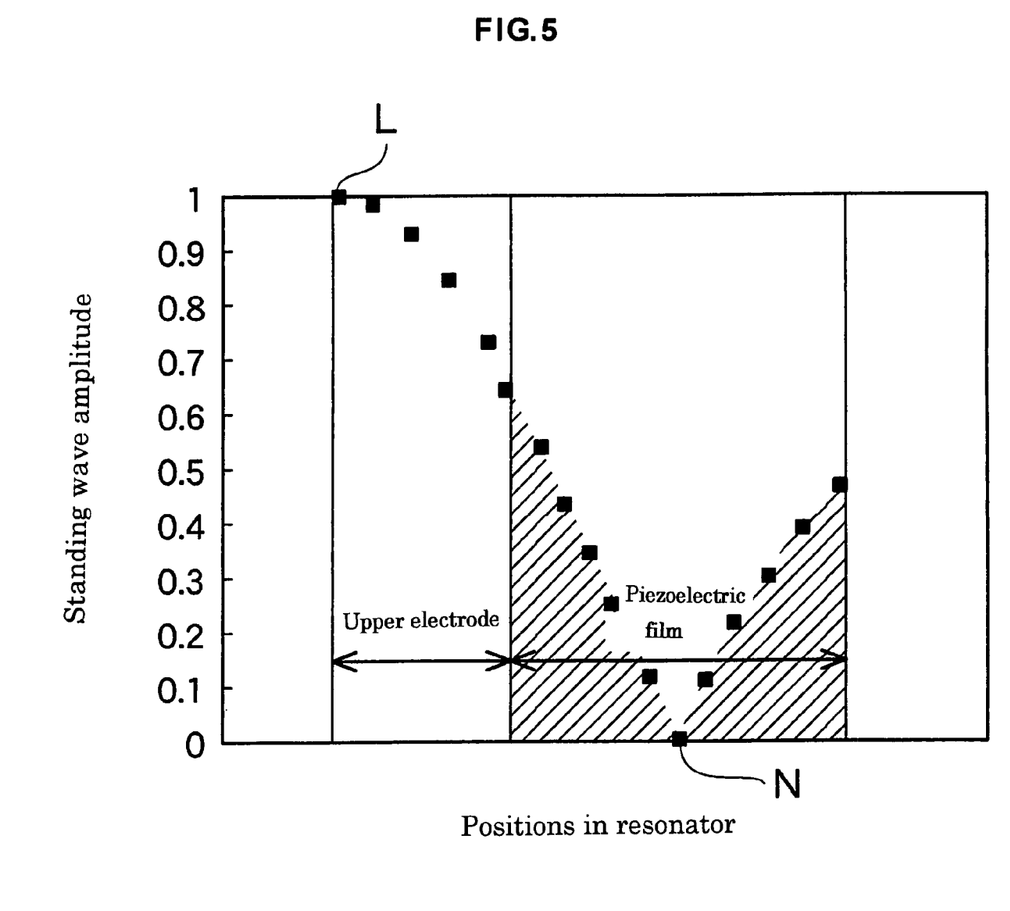
FIG. 5 is a graph showing standing wave distribution in the conventional piezoelectric resonator.
Figure 6:
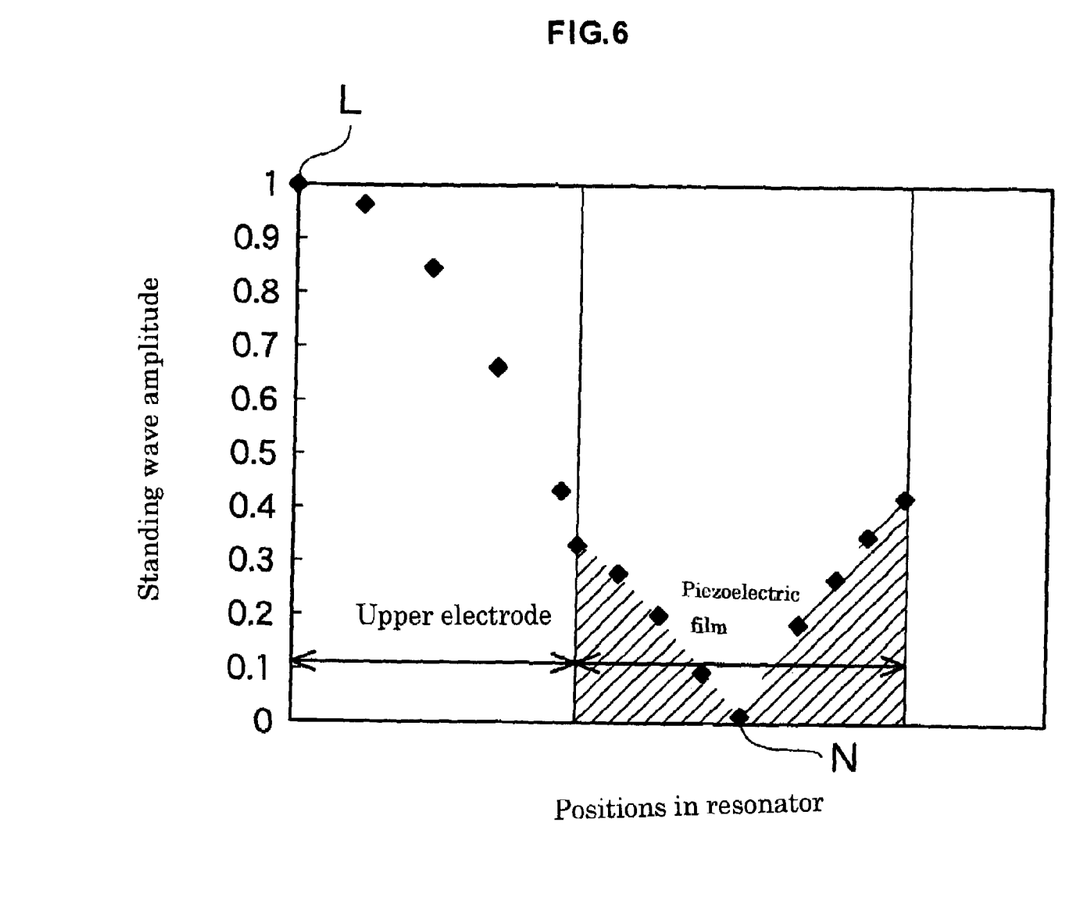
FIG. 6 is a graph showing standing wave distribution in another conventional piezoelectric resonator.
Figure 7:
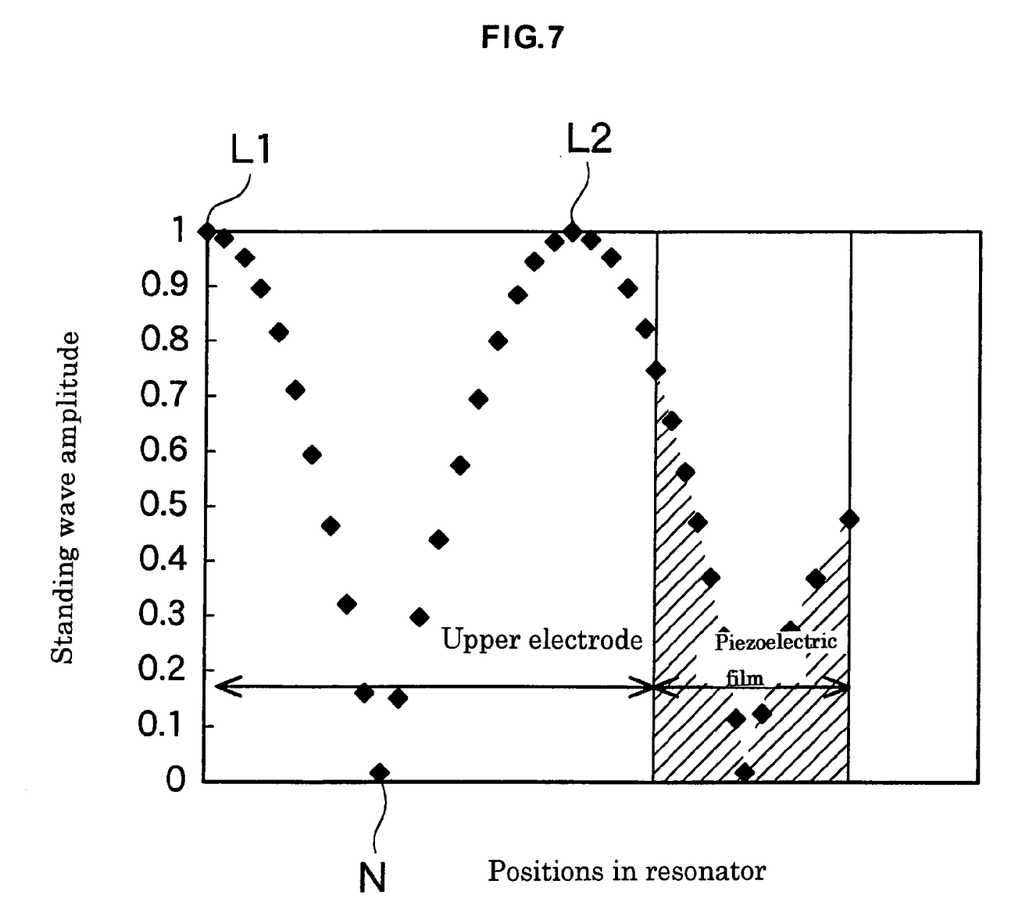
FIG. 7 is a graph showing standing wave distribution in the piezoelectric resonator shown in FIG. 1.
Figure 8:
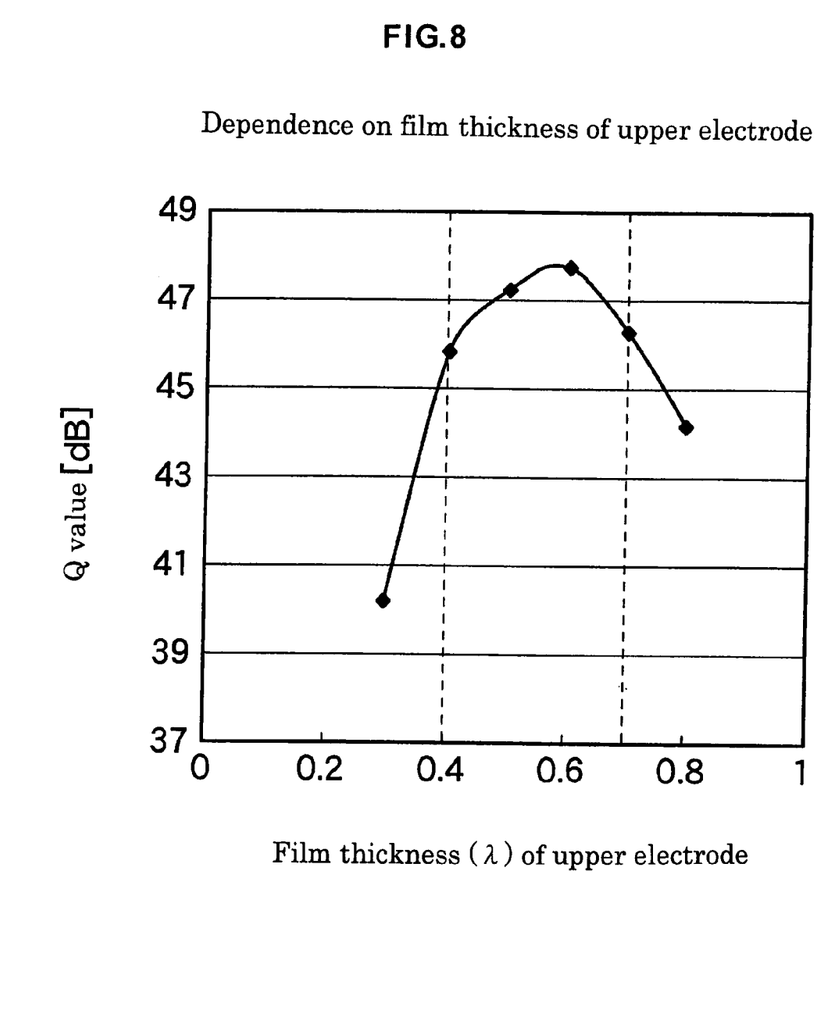
FIG. 8 is a graph showing a relation between a normalized film thickness of the upper electrode and a Q value.
Figure 9:
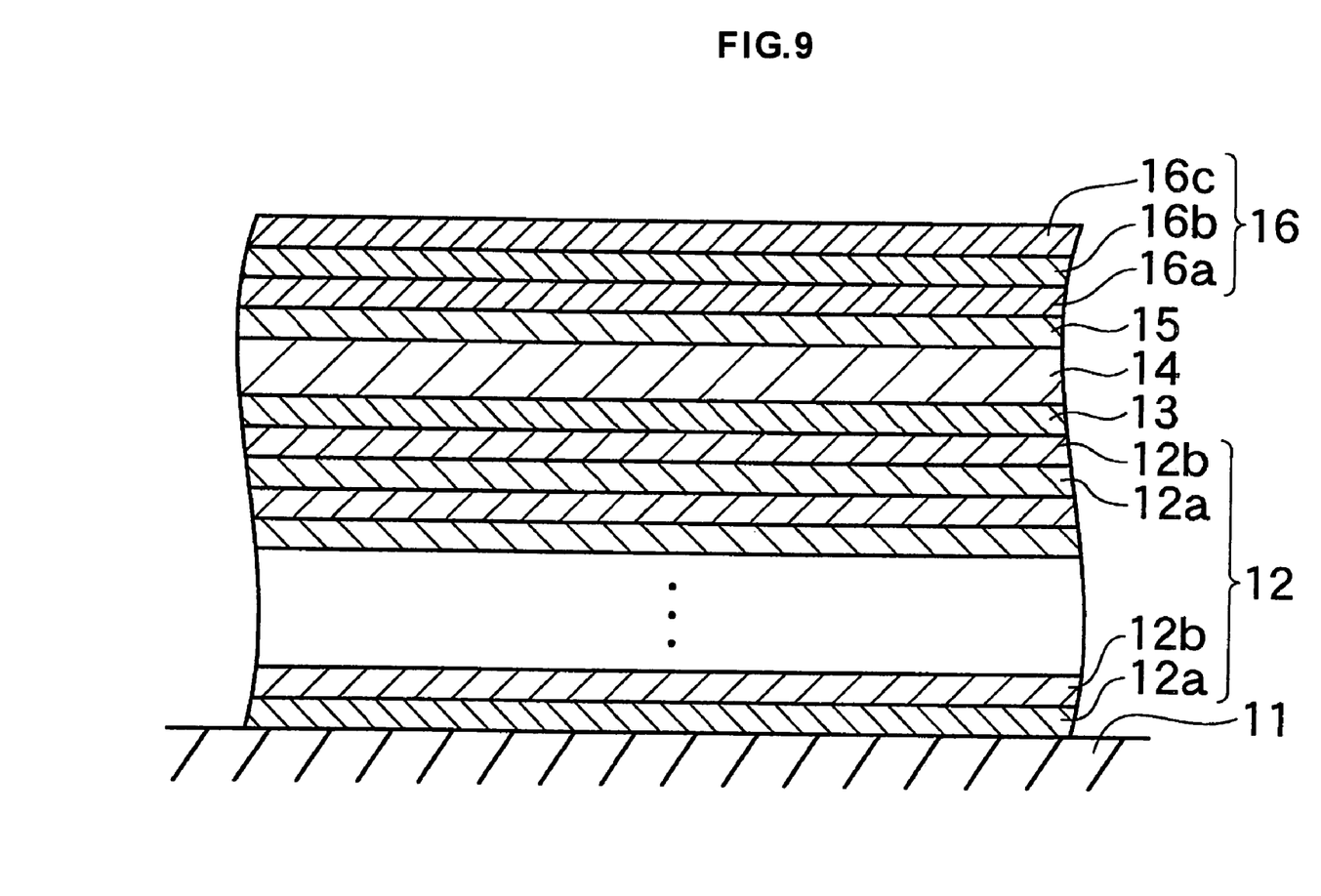
FIG. 9 is a cross-sectional view illustrating a piezoelectric resonator as claimed in another embodiment of the present invention.
Figure 10:
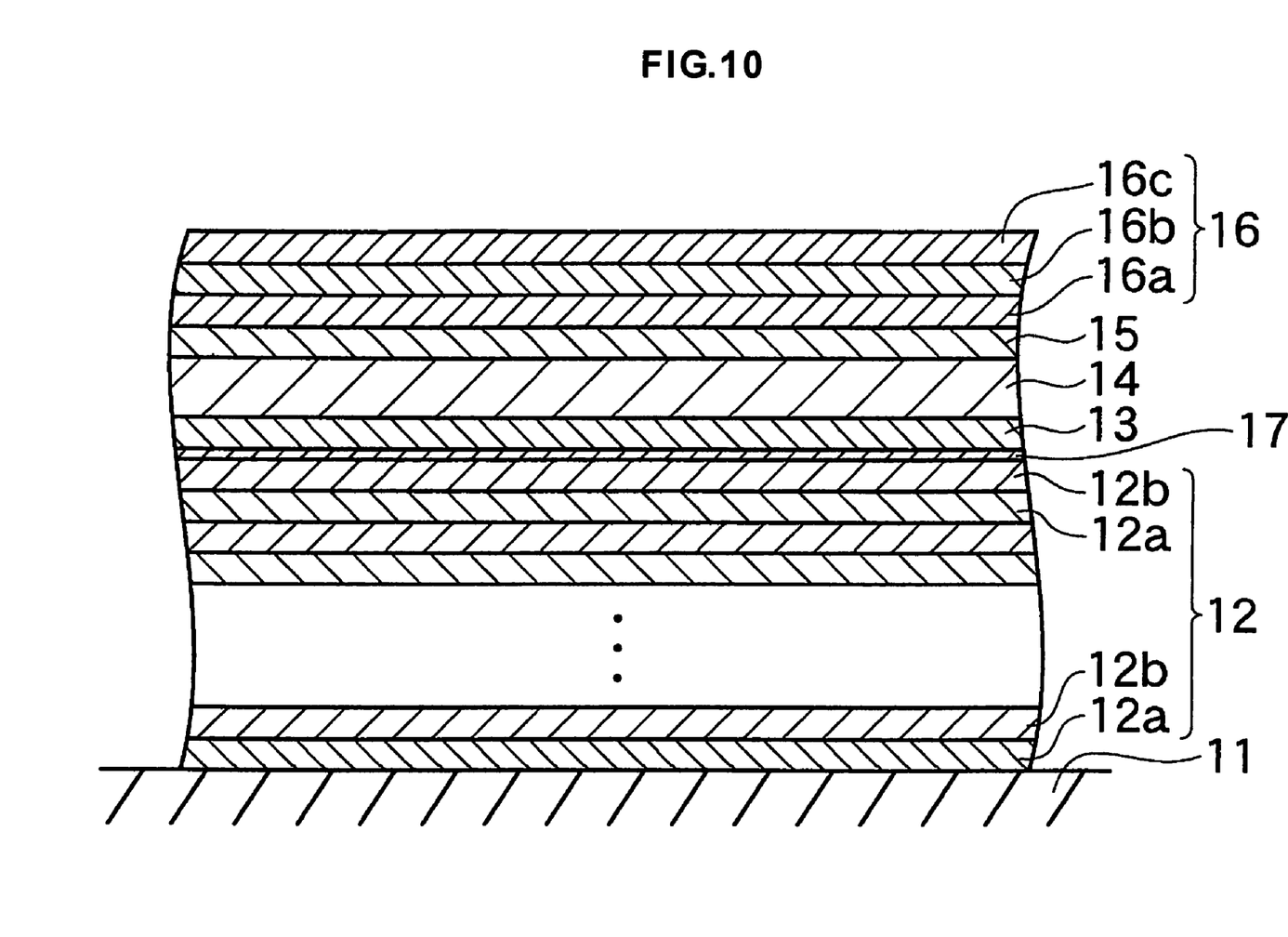
FIG. 10 is a cross-sectional view illustrating a piezoelectric resonator as claimed in still another embodiment of the present invention.

FIG. 1 is a cross-sectional view illustrating a piezoelectric resonator as claimed in an embodiment of the present invention. FIG. 2 is a graph showing resonance characteristics of a conventional piezoelectric resonator having upper electrodes whose film thicknesses are different from each other. FIG. 3 is a graph showing a resonance characteristic of a piezoelectric resonator studied by the inventor of the present invention. FIG. 4 is a graph showing a resonance characteristic of the piezoelectric resonator shown in FIG. 1 in which the film thickness of the upper electrode is changed. FIG. 5 is a graph showing standing wave distribution in the conventional piezoelectric resonator. FIG. 6 is a graph showing standing wave distribution in another conventional piezoelectric resonator. FIG. 7 is a graph showing standing wave distribution in the piezoelectric resonator shown in FIG. 1. FIG. 8 is a graph showing a relation between a normalized film thickness of the upper electrodes and a Q value. FIG. 9 is a cross-sectional view illustrating a piezoelectric resonator as claimed in another embodiment of the present invention. FIG. 10 is a cross-sectional view illustrating a piezoelectric resonator as claimed in still another embodiment of the present invention.

The piezoelectric resonator shown in FIG. 1 is one called an SMR-type piezoelectric resonator in which an acoustic multi-layer film 12 is formed which is made up of thin films each having a different acoustic impedance, for example, of an AlN film 12$a$ having a high acoustic impedance and an $SiO_2$ film 12$b$ having a low acoustic impedance, each being stacked alternately on one side of a substrate 11 made of silicon or glass. On the acoustic multi-layer film 12 are sequentially stacked a lower electrode 13 made of, for example, Al, a piezoelectric film 14 made of, for example, AlN or ZnO (Zinc Oxide), a dielectric film 15 made of, for example, $SiO_2$, an upper electrode 16 made of, for example, Al, on each of which patterning is performed so that each of them has a specified shape.

In such the piezoelectric resonator as above, when an alternating voltage is applied between the lower electrode 13 and the upper electrode 16, both serving as an electrode for excitation, to let a BAW, which is produced by a piezoelectric effect, propagate through inner portions of the piezoelectric layer 14, a signal having a specified resonant frequency is obtained.

Also, the formation of the acoustic multi-layer 12 is not required, when the lower electrode 13 is formed directly on the substrate 11. The lower electrode 13 and the upper electrode 16 may be made up of other conductive materials including, for example, Au or Mo. Moreover, the dielectric film 15 not only may be made up of a dielectric other than $SiO_2$ film but also may not be formed.

Furthermore, when the substrate 11 is placed in a lowest position in the piezoelectric resonator, an electrode placed in an upper position is called the upper electrode 16 and the electrode placed in a lower position is called the lower electrode 13.

Here, in the embodiment, a film thickness of the upper electrode 16 is set to be 1.9 μm. This film thickness of the upper electrode 16 obtained when a wavelength of a standing wave occurring in the vicinity of a resonant frequency in a frequency band being used is defined as "λ" is equivalent to 0.57 λ. Since a wavelength of a standing wave differs depending on a kind of the film (that is, on a kind of an electrode or of a film to be used), the wavelength of the standing wave cited in the present specification denotes a wavelength specific to each of the standing waves occurring in each of the electrodes or in each thin film.

The resonance characteristic of the conventional piezoelectric resonator is shown in FIG. 2. In FIG. 2, the resonance characteristics obtained when the film thickness is 0.3 μm (0.09 μ), 0.5 μm (0.15λ), and 0.7 μm (0.21λ) in the piezoelectric resonator having the upper electrode made of Al are shown.

As is apparent from FIG. 2, as the film thickness of the upper electrode is made larger, the resonant frequency becomes lower and an effective coupling coefficient becomes smaller. To use the piezoelectric resonator in which the thickness of the upper electrode has been made larger, in a desired frequency, the thickness of the lower electrode or piezoelectric film has to be adjusted. However, since a resonance characteristic is degraded by the above operations, conventionally, further considerations are not given to the film thickness.

Now, the inventor of the present invention has fabricated the piezoelectric resonator in which a thickness of its upper electrode is made larger for further study. A resonance characteristic in the piezoelectric resonator studied by the inventor is shown in FIG. 3. FIG. 3 shows the resonance characteristic obtained when the thickness of the upper electrode is 1.1 μm (0.33λ).

As shown in FIG. 2, the larger the thickness of the upper electrode becomes, the lower the resonant frequency becomes. Therefore, as shown in FIG. 3, a resonant region in frequency bands in which the resonance characteristic has been degraded is between 1 GHz and 1.5 GHz. Also, as shown in FIG. 3, a new resonant region has occurred on a high frequency band side, that is, between about 2.3 GHz and 2.5 GHz.

Therefore, the inventor has fabricated a piezoelectric resonator in which a thickness of the upper electrode is made further larger. FIG. 4 shows resonance characteristics obtained when the film thickness of the upper electrode is set to be 1.34 μm (0.4λ), 1.9 μm (0.57λ), and 2.35 μm (0.7 λ). The film thickness of 1.9 μm is the film thickness of the upper electrode in the piezoelectric resonator fabricated as a result of a series of studies described above. As shown in FIG. 4, a resonance characteristic cannot be anymore confirmed in the resonant region in the frequency band in which the resonance characteristic has been degraded, however, in the resonant region occurred between about 1.7 GHz and 2.5 GHz, a resonance characteristic indicating a very excellent Q characteristic is provided, which can be suitably applied in a resonator.

Standing wave distribution in a piezoelectric resonator having an upper electrode whose film thickness is 0.4 μm (0.12λ) is shown in FIG. 5. Standing wave distribution in the piezoelectric resonator having an upper electrode whose film thickness is 0.7 μm (0.21λ) is shown in FIG. 6. Standing wave distribution in the piezoelectric resonator having an upper electrode whose film thickness is 1.9 μm (0.57λ) is shown in FIG. 7. The standing wave distribution shown in FIGS. 5 and 6 corresponds to the resonance characteristic in the resonant region in the conventional piezoelectric resonator shown in FIG. 2. The standing wave distribution shown in FIG. 7 corresponds to the resonance characteristic in the resonant region occurred newly in the piezoelectric resonator of the embodiment of the present invention. In the graphs in FIG. 5 to FIG. 7, a standing wave amplitude normalized by defining a maximum amplitude as 1 (one) is plotted as ordinate and positions of the standing waves in the resonator as abscissa. Moreover, descriptions of standing waves occurring outside of the upper electrode and piezoelectric film are omitted.

FIGS. 5 and 6 show that, in the distribution of the standing wave occurring in the vicinity of the resonant frequency in the frequency band being used in the conventional piezoelectric resonator, a wave loop "L" of the standing wave has been formed at an interface being opposite to a piezoelectric film of the upper electrode and a wave node (point at which no oscillation occurs) "N" of the standing wave has been formed in the piezoelectric film.

FIG. 7 shows that, in the distribution of the standing wave occurring in the vicinity of the resonant frequency in the frequency band being used in the piezoelectric resonator having the upper electrode whose film thickness is 1.9 μm (0.57λ), unlike in the case of the conventional piezoelectric resonator shown in FIGS. 5 and 6, a first wave loop L1 (point at which oscillation occurs at a maximum level) has been formed at an interface being opposite to the piezoelectric film in the upper electrode (that is, at an interface between the upper electrode and air) and both a wave node N (point at which no oscillation occurs) and a second wave loop L2 have been formed within the upper electrode directing toward a side of the piezoelectric film from the interface between the upper electrode and air. Therefore, in such the piezoelectric resonator as having the first wave loop L1, wave node N, second wave loop L2 on the upper electrode, a resonance characteristic that, though a film thickness is large, a Q characteristic is very excellent can be obtained.

Next, reasons why the resonant characteristic in the resonant region occurred newly is more excellent than that in the conventional piezoelectric resonator are described below.

That is, in these graphs, an area of portions shown by sloped lines in a piezoelectric film region corresponds to oscillation energy that can be effectively used by a piezoelectric resonator and the larger the area is, the more excellent the resonance characteristic is.

Thus, in the conventional piezoelectric resonator, since a wave loop L of the standing wave is formed at the interface between the upper electrode and air and a wave node N of the standing wave is formed in the piezoelectric film and the wave node N is not formed in the upper electrode, when the film thickness of the upper electrode is made larger, a state of the standing wave shifts from that shown by FIG. 5 to the state shown by FIG. 6. That is, in order to satisfy an interface condition that the wave loop L of the standing wave should be formed at the interface between the upper electrode and air, the oscillation energy in the upper electrode leaks out and, as a result, the area shown by the sloped lines in the piezoelectric film in the graph decreases, resulting in degradation in a characteristic as a resonator.

On the other hand, in the case of the standing wave distribution in the piezoelectric resonator having the resonant region occurred newly, though the wave loop L (first wave loop L1) is formed at the interface between the upper electrode and air as in the case of the conventional piezoelectric resonator, the wave node N of the standing wave is formed not only in the piezoelectric film but also in the upper electrode and another wave loop L (second wave loop L2) is formed also in the vicinity of the interface between the piezoelectric film in the upper electrode and air. Thus, since both the wave node N and the second wave loop L2 are formed in the upper electrode, even if the film thickness of the upper electrode is made larger, the degradation in amplitudes of the standing wave in the vicinity of the interface between the piezoelectric film in the upper electrode and air becomes small and the decrease in the area shown by the sloped lines in the piezoelectric film, that is, the decrease in the effective oscillation energy can be suppressed, which can provide an excellent resonance characteristic.

The standing wave in a mode in which the first wave loop L1, wave node N, and second wave loop L2 are formed is found in the piezoelectric resonator having the resonant region occurred newly (see FIG. 4). Here, a relation between a normalized film thickness of the upper electrode and a Q value is shown in FIG. 8. Generally, it is desirous that a Q value of a piezoelectric resonator is 45 dB or more. It can be, therefore, thought from FIG. 8 that, when the film thickness of the upper electrode is between 0.4λ to 0.7λ, the Q characteristic becomes better, that is, the standing wave of the mode described above is formed in the upper electrode.

As described above, as claimed in the piezoelectric resonator of the present invention, since the standing wave occurring in the upper electrode has the wave node N and second wave loop L2 in addition to the first wave loop L1, a decrease in oscillation energy of the bulk acoustic wave in the piezoelectric film can be suppressed, which can provide an excellent Q characteristic. Since such the distribution of the standing wave is realized by making larger the film thickness of the upper electrode, it is made possible to achieve the piezoelectric resonator having an excellent Q characteristic while making larger the film thickness of the upper electrode.

Thus, since the film thickness of the upper electrode can be made larger, a process, aside from the process of forming the electrode film, of forming a film being thicker than an electrode film to be used as a wiring layer to lower electrical resistance of a wiring is not required and, since formation of a wiring layer having a large thickness and of low resistance by using the same process as employed for the formation of the upper electrode is made possible, simplification of the processes and reduction of manufacturing costs can be achieved.

The piezoelectric resonator using the standing wave of such the mode can be effectively used for applications in a region of a high frequency being several GHz or more. This indicates that an increase in a resonant frequency for the piezoelectric resonator can be realized mainly by making larger a thickness of a piezoelectric film. A thickness of an upper electrode in a piezoelectric resonator conventionally makes up 25% to 65% of a thickness of a piezoelectric film and, as a result, there is a fear that, in the applications in a region of a high frequency being 3 GHz or more, a thickness of an upper electrode becomes extremely small as a thickness of a piezoelectric film becomes small, which causes an increase in electrical resistance and degradation in a Q characteristic of the piezoelectric resonator. However, as claimed in the present invention, since a thickness of an upper electrode is allowed to be larger, the piezoelectric resonator having an excellent Q characteristic by suppressing an increase in electrical resistance can be obtained.

Moreover, as shown in FIG. 9, the upper electrode 16 may be formed by sequentially stacking layers in the order of a conductive layer 16a, an insulating layer 16b, and another conductive layer 16c. As a material for the conductive layer 16a, for example, an Al film being $0.05\lambda$ in thickness can be used. As a material for the insulating layer 16b, for example, an $SiO_2$ film being $0.08\lambda$ in thickness can be used. As a material for the conductive layer 16c, for example, an Al film being $0.05\lambda$ in thickness can be used. Here, an acceptable total of coefficients of thicknesses normalized by using a wavelength $\lambda$ of a standing wave in each of the above layers is 0.4 to 0.7 (in the above case, 0.05+0.08+0.5=0.63). However, it is natural that materials other than described above may be used.

By using a $SiO_2$ film as a material for the insulating layer 16b, a temperature characteristic of the piezoelectric resonator can be improved. Moreover, it is not necessarily required that the conductive layer 16a and conductive layer 16c are brought into mutual conduction.

Furthermore, as shown in FIG. 10, by forming an interlayer film 17 having a specified acoustic impedance and having a film thickness obtained when a wavelength of the standing wave is defined as "$\lambda$" being $0.01\lambda$ to $0.1\lambda$ between the acoustic multi-layer 12 and the lower electrode 13, it is made possible to achieve a piezoelectric resonator having a more excellent Q characteristic. Here, as the interlayer film 17, a film being high in acoustic impedance, for example, an AlN film is preferably used.

It is apparent that the present invention is not limited to the above embodiments but may be changed and modified without departing from the scope and spirit of the invention.

For example, in the above description, the case in which the present invention is applied to the SMR-type piezoelectric resonator is explained, however, the present invention is not limited to this. That is, the present invention may be applied generally to layer-stacked-type piezoelectric resonator using a piezoelectric film such as a diaphragm-type piezoelectric resonator in which a BAW can be easily propagated by partially notching a substrate or a like.

Moreover, even in the case of the diaphragm-type piezoelectric resonator, as in the case of the SMR-type piezoelectric resonator, the acoustic multi-layer film may or may not be formed. However, in the diaphragm-type piezoelectric resonator in which the acoustic multi-layer has not been formed, unlike in the case of the SMR-type piezoelectric resonator, in order to make oscillating portions of the lower electrode oscillate freely, the substrate to be formed immediately below the lower electrode has been removed and does not exist.

What is claimed is:

1. A piezoelectric resonator comprising:
   a substrate;
   a lower electrode formed on said substrate;
   an upper electrode formed on said substrate; and
   a piezoelectric film being sandwiched between said lower electrode and said upper electrode on said substrate,
   wherein a signal having a specified resonant frequency is obtained by applying a voltage between said lower electrode and said upper electrode to let a bulk acoustic wave propagate through an inner portion of said piezoelectric film, and
   wherein a standing wave occurring in a vicinity of a resonant frequency in a frequency band being used has a first wave loop at an interface positioned on a side opposite to said piezoelectric film in said upper electrode and both a wave node and a second wave loop in an inner portion of said upper electrode in a direction from said interface toward a side of said piezoelectric film.

2. The piezoelectric resonator as claimed in claim 1, wherein a film thickness of said upper electrode obtained when a wavelength of said standing wave occurring in said upper electrode is defined as "$\lambda$" is $0.4\lambda$ to $0.7\lambda$.

3. The piezoelectric resonator as claimed in claim 1, wherein said upper electrode comprises one of Al (aluminum), Au (gold), and Mo (molybdenum).

4. The piezoelectric resonator as claimed in claim 1, wherein said upper electrode comprises a stack of layers, said stack comprising a conductive layer, an insulating layer, and another conductive layer.

5. The piezoelectric resonator as claimed in claim 4, wherein said upper electrode comprises a stack of films, said stack comprising an Al film an $SiO_2$ (silicon oxide) film, and another Al film and a sum of coefficients of film thicknesses normalized by a wavelength of said standing wave occurring in each of said films is 0.4 to 0.7.

6. The piezoelectric resonator as claimed in claim 1, further comprising:
   an acoustic multi-layer film constructed by stacking films each having a different acoustic impedance and formed between said substrate and said lower electrode; and
   an interlayer film having a specified acoustic impedance and having a film thickness obtained when a wavelength of said standing wave is defined as "$\lambda$" being $0.01\lambda$ to $0.1\lambda$ which is formed between said acoustic multi-layer film and said lower electrode.

7. The piezoelectric resonator as claimed in claim 6, wherein said interlayer film comprises an AlN (Aluminum Nitride) film.

8. The piezoelectric resonator as claimed in claim 1, further comprising:
a dielectric film formed between said upper electrode and said piezoelectric film.

9. The piezoelectric resonator as claimed in claim 8, wherein said dielectric film comprises an $SiO_2$ film.

10. The piezoelectric resonator as claimed in claim 1, wherein said piezoelectric resonator comprises one of an SMR (Solidity Mounted Resonator)—type piezoelectric resonator and a diaphragm-type piezoelectric resonator.

11. An electronic component using the piezoelectric resonator stated in claim 1.

12. The piezoelectric resonator as claimed in claim 1, wherein a thickness of said upper electrode is based on a wavelength of said standing wave occurring in said upper electrode.

13. The piezoelectric resonator as claimed in claim 1, wherein a thickness of said upper electrode is sufficient to form said standing wave.

14. The piezoelectric resonator as claimed in claim 1, wherein a thickness of said upper electrode is at least $0.4\lambda$, where "$\lambda$" comprises a wavelength of said standing wave occurring in said upper electrode.

15. The piezoelectric resonator as claimed in claim 1, wherein said upper electrode comprises a thickness which is greater than 65% of a thickness of said piezoelectric film.

16. A piezoelectric resonator comprising:
a lower electrode formed on a substrate;
a piezoelectric film formed on said lower electrode; and
an upper electrode formed on said piezoelectric film and comprising a thickness such that a standing wave occurring in a vicinity of a resonant frequency in a frequency band being used by said resonator comprises a first wave, a wave node and a second wave loop in said upper electrode.

17. The piezoelectric resonator as claimed in claim 16, wherein said first wave loop is formed at an interface positioned on a side opposite to said piezoelectric film in said upper electrode, and said wave node and said second wave loop are formed in an inner portion of said upper electrode in a direction from said interface toward a side of said piezoelectric film.

18. A method of forming a piezoelectric resonator, said method comprising:
forming a lower electrode on a substrate;
forming a piezoelectric film on said lower electrode; and
forming an upper electrode on said piezoelectric film, said upper electrode comprising a thickness such that a standing wave occurring in a vicinity of a resonant frequency in a frequency band being used by said resonator comprises a first wave, a wave node and a second wave loop in said upper electrode.

* * * * *